US012512329B2

(12) United States Patent
Dorfner et al.

(10) Patent No.: US 12,512,329 B2
(45) Date of Patent: Dec. 30, 2025

(54) MULTI LEVEL CONTACT ETCH (71) Applicant: Tokyo Electron Limited, Tokyo (JP)

(72) Inventors: Alec Dorfner, Miyagi (JP); Minjoon Park, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 251 days.

(21) Appl. No.: 18/296,503

(22) Filed: Apr. 6, 2023

(65) Prior Publication Data
US 2024/0339328 A1    Oct. 10, 2024

(51) Int. Cl.
| | |
|---|---|
| H01L 21/311 | (2006.01) |
| H01L 21/02 | (2006.01) |
| H01L 21/033 | (2006.01) |
| H01L 21/3105 | (2006.01) |
| H01L 21/768 | (2006.01) |
| H01L 23/528 | (2006.01) |
| H01L 23/532 | (2006.01) |
| H10B 41/35 | (2023.01) |
| H10B 43/35 | (2023.01) |

(52) U.S. Cl.
CPC .. *H01L 21/31116* (2013.01); *H01L 21/02164* (2013.01); *H01L 21/0217* (2013.01); *H01L 21/0332* (2013.01); *H01L 21/31051* (2013.01); *H01L 21/31144* (2013.01); *H01L 21/76819* (2013.01); *H01L 21/76834* (2013.01); *H01L 21/76877* (2013.01); H01L 23/5283 (2013.01); H01L 23/53257 (2013.01); *H10B 41/35* (2023.02); *H10B 43/35* (2023.02)

(58) Field of Classification Search
None
See application file for complete search history.

(56) References Cited

U.S. PATENT DOCUMENTS

| 8,828,884 B2 | 9/2014 | Lee et al. |
| 9,202,707 B2 | 12/2015 | Kawamata et al. |
| (Continued) | | |

FOREIGN PATENT DOCUMENTS

| KR | 2011-0001527 | * | 1/2011 |
| KR | 20110001527 A | | 1/2011 |

OTHER PUBLICATIONS

International Search Report and Written Opinion, PCT/US2024/011577, mailed May 13, 2024, Total p. 12.

*Primary Examiner* — Binh X Tran
(74) *Attorney, Agent, or Firm* — Slater Matsil, LLP (57) ABSTRACT

A method of processing a substrate that includes: forming a conformal etch stop layer (ESL) over a staircase pattern of the substrate, the staircase pattern including staircases, each of the staircases including a conductive surface; forming a dielectric layer over the ESL; planarizing a top surface of the dielectric layer; forming a patterned hardmask over the dielectric layer; and etching the dielectric layer selectively to the ESL using the patterned hardmask as an etch mask to form a plurality of recesses, each of the plurality of recesses landing on each of the staircases, the ESL protecting the conductive surface from the etching, the etching including exposing the substrate to a plasma generated from a process gas including a fluorocarbon, $O_2$, and $WF_6$, a flow rate of $WF_6$ being between 0.01% and 1% of a total gas flow rate of the process gas.

20 Claims, 9 Drawing Sheets

(56) References Cited

U.S. PATENT DOCUMENTS

| | | |
|---|---|---|
| 9,384,992 B2 | 7/2016 | Narishige et al. |
| 10,741,407 B2 | 8/2020 | Dole et al. |
| 2014/0120732 A1* | 5/2014 | Matsumoto ............ H10B 41/27 438/723 |
| 2016/0329345 A1* | 11/2016 | Hu ....................... H10D 64/661 |
| 2017/0117222 A1 | 4/2017 | Kim et al. |
| 2020/0126804 A1* | 4/2020 | Dole ................. H01L 21/32133 |
| 2022/0148971 A1 | 5/2022 | Lamborn et al. |
| 2022/0181141 A1* | 6/2022 | van Schravendijk ........................ H01L 21/0217 |
| 2022/0208788 A1* | 6/2022 | Okamoto ............... H10B 41/27 |
| 2022/0262601 A1 | 8/2022 | Watanabe et al. |
| 2022/0285364 A1* | 9/2022 | Fishburn ............... H10B 12/30 |

* cited by examiner

MULTI LEVEL CONTACT ETCH

TECHNICAL FIELD

The present invention relates generally to method of processing a substrate, and, in particular embodiments, to multi-level contact etch.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

To increase the number of transistors and other semiconductor devices per unit area, manufacturers are now utilizing the vertical dimension (3D). For example, in a 3D NAND memory array, charge trapping flash transistors are stacked vertically one on top of another on the sidewalls in high aspect ratio openings. Manufacturing such a 3D stacked semiconductor memory includes a series of plasma etching process for forming deep holes or deep trenches on a multilayer stacked film. As device structures densify and develop vertically, the desire for precision material processing, including etching process, becomes more compelling. Trade-offs between etch rate, selectivity, profile control, and uniformity in plasma processes can be difficult to manage. Thus, improving etch process techniques is desirable in order to precisely manipulate materials and meet advanced scaling challenges.

SUMMARY

In accordance with an embodiment of the present invention, a method of processing a substrate that includes: forming a conformal etch stop layer (ESL) over a staircase pattern of the substrate, the staircase pattern including a plurality of staircases, each of the plurality of staircases including a conductive surface; forming a dielectric layer over the ESL; planarizing a top surface of the dielectric layer; forming a patterned hardmask layer over the dielectric layer; and etching the dielectric layer selectively to the ESL using the patterned hardmask layer as an etch mask to form a plurality of recesses, each of the plurality of recesses landing on each of the plurality of staircases, the ESL protecting the conductive surface from the etching, the etching including exposing the substrate to a plasma generated from a process gas including a fluorocarbon, dioxygen ($O_2$), and tungsten hexafluoride ($WF_6$), a flow rate of $WF_6$ being between 0.01% and 1% of a total gas flow rate of the process gas.

In accordance with an embodiment of the present invention, a method of forming a 3D NAND memory cell that includes: forming a staircase pattern including multiple staircases over the substrate, each staircase including a word line including a refractory metal; forming a conformal etch stop layer (ESL) including silicon nitride over the staircase pattern; forming a planarized dielectric layer including silicon oxide over the ESL; forming a patterned hardmask layer including carbon over the dielectric layer; and forming a plurality of contact holes by etching the dielectric layer selectively to the ESL using the patterned hardmask layer as an etch mask, the plurality of contact holes aligned with the staircase pattern such that each contact hole lands on each staircase, each word line being covered by the ESL after the etching, the etching including flowing first and second fluorocarbons, dioxygen ($O_2$), a diluent gas, and tungsten hexafluoride ($WF_6$) to a plasma processing chamber, a flow rate of $WF_6$ being between 1% and 2% of a flow rate of the first fluorocarbon, and exposing the substrate to a plasma generated in the plasma processing chamber while flowing the gases.

In accordance with an embodiment of the present invention, a method of processing a substrate that includes: forming a conformal etch stop layer (ESL) over a staircase pattern of the substrate, the staircase pattern including a plurality of conductive surfaces, each of the plurality of conductive surfaces is separated and at a different level from each other; forming a planarized dielectric layer over the ESL; forming a patterned hardmask layer over the dielectric layer; and etching the dielectric layer selectively to the ESL using the patterned hardmask layer as an etch mask, the etching including exposing the substrate to a first plasma generated in a plasma processing chamber from a first process gas including a fluorocarbon, the exposing to the first plasma forming a plurality of recesses aligned with the plurality of conductive surfaces, and after one of the plurality of recesses reaches at a portion of the ESL disposed over an uppermost one of the plurality of conductive surfaces, exposing the substrate to a second plasma generated in the plasma processing chamber from a second process gas including the fluorocarbon, dioxygen ($O_2$), and tungsten hexafluoride ($WF_6$), the exposing to the second plasma extending the plurality of recesses while the ESL prevents each of the plurality of conductive surfaces from being exposed at the bottom of each of the plurality of recesses.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2G illustrate cross-sectional views of an example substrate at various stages of fabricating a 3D NAND memory array in accordance with various embodiments, wherein

FIGS. 3A-3C illustrate process flow charts of methods of multi-level contact etch in accordance with various embodiments, wherein FIG. 3A illustrates an embodiment.

DETAILED DESCRIPTION OF ILLUSTRATIVE EMBODIMENTS

This application relates to a method of processing a substrate, more particularly to multi-level contact (MLC) etch in fabrication of a 3D NAND memory device. A MLC etch is a crucial step of a typical 3D NAND memory fabrication process in order to enable forming an array of contact holes with different depth to contact each of the memory cells formed in a stacked multiple layer structure. It is not trivial to form such contact holes with varying depth in the same layer in a controlled fashion because the etching must stop at shallow holes once they are formed while having to continue to extend other holes to their target depth. The MLC etch therefore have to be extremely selective to underlying layers (e.g., an etch stop layer). One known solution is to optimize a process gas composition for a plasma and introduce a large amount of passivating polymeric deposits (e.g., CF polymers formed from fluorocarbons) over the features being formed. However, this approach often suffers from issues such as slower etch rate, bowing, clogging, and striation. In addition, under etch, CD non-uniformity (e.g., smaller bottom CD), and undesired etch stop may also occur in some cases. Therefore, a new method for MLC etch may be desired. Embodiments of the present application disclose methods of plasma etching to form recesses that vary in depth using a small addition of tungsten hexafluoride ($WF_6$) to the process gas to improve both its selectivity and etch rate.

The methods described in this disclosure may advantageously improve the process of fabricating a 3D NAND memory device by improving the selectivity during a multi-level contact (MLC) etch. In one embodiment, for an oxide etch using fluorocarbons, a small addition of $WF_6$ can substantially improve the etch selectivity to nitride that may be used as an etch stop layer (ESL). In addition, the methods may also alleviate the issue of contact deformation such as bowing. Advantageously, various embodiments may also improve bottom critical dimension (CD) of contact holes.

In the following, an example 3D NAND memory array, where a MLC etch may be applied to, is first described referring to FIG. 1. Process steps, including the MLC etch, to fabricate such a structure are then described referring to FIGS. 2A-2G in accordance with various embodiments. Example process flow diagrams are illustrated in FIG. 3A-3C. All figures in this disclosure are drawn for illustration purpose only and not to scale, including the aspect ratios of features. Although the description below in this disclosure is mainly for a MLC etch for fabricating a 3D NAND memory device, the methods herein may also be applied to any other etch processes to form multiple recesses that vary in depth where a high selectivity is required. Further, the feature to be formed by the methods are not limited to a contact hole and include slit or other suitable structures comprising a recess.

Figure 1:
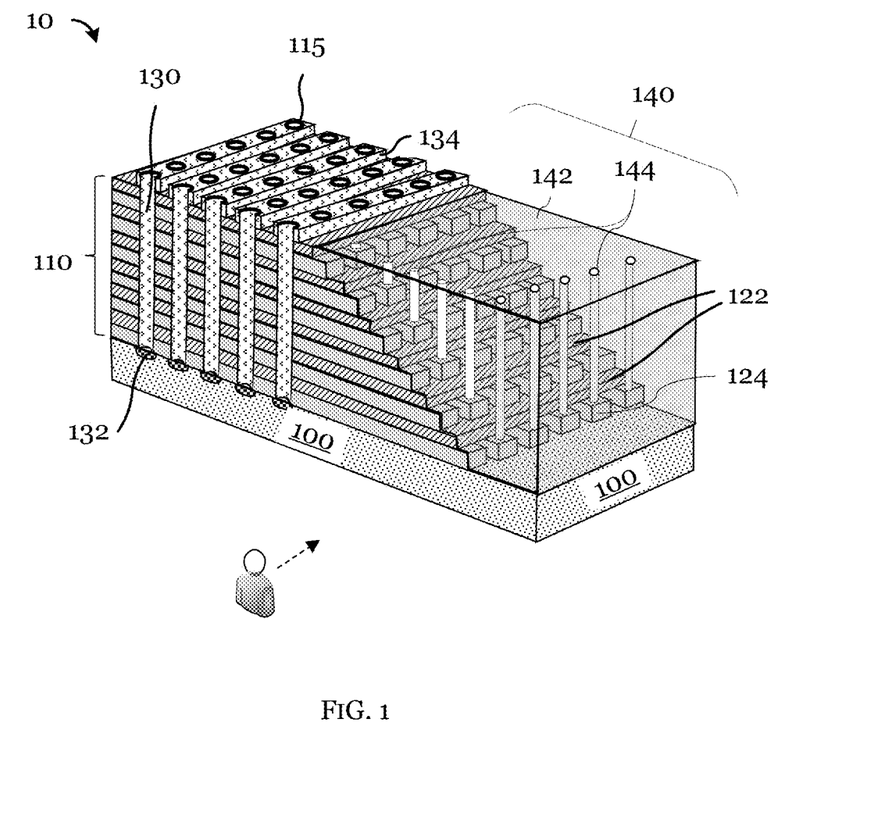
FIG. 1 illustrates a three dimensional (3D) isometric projection view of a 3D NAND memory array with a staircase structure in accordance with various embodiments.

FIG. 1 illustrates a three dimensional (3D) isometric projection view of a 3D NAND memory array 10 with a staircase structure 140 in accordance with various embodiments.

To clarify the process being described, a partial three-dimensional isometric projection view of the 3D NAND memory array 10 being fabricated over a substrate 100 is illustrated in FIG. 1. The structure illustrated in FIG. 1 is only for example and some portions (e.g., transistor channel material) are not illustrated in FIG. 1. Although this embodiment is illustrated using charge trapping flash (CTF) transistors, embodiments may also be applied to 3D NAND technology made with floating gate technology.

In various embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1, the substrate 100 may comprise a 3D NAND dielectric stack 110 comprises alternating layers of a dielectric 122 such as silicon oxide and a series of word lines 124. In certain embodiments, the word lines 124 may comprise a refractory metal such as tungsten (W), molybdenum (Mo), and ruthenium (Ru). Process flow to form the word lines 124 may include first forming a layer stack comprising the dielectric 122 and a sacrificial dielectric layer such as silicon nitride, followed by replacing the sacrificial dielectric layer with a conductive material to form the word lines 124. Although the 3D NAND dielectric stack 110 is shown to include a particular number of layers, the 3D NAND dielectric stack 110 may include as few as two layers and upwards of one-hundred layers or more. In one or more embodiments, the 3D NAND dielectric stack 110 may be used to fabricate 32- or 48-layer NAND memory devices. The number of layers expected to be a part of the 3D NAND dielectric stack 143 likely will continue to increase over time to provide larger and larger 3D NAND memory devices, and the methods of this disclosure may be applied to such large stack structures as well.

CTF transistors are formed on the sidewalls of high aspect ratio channel openings 115 formed through the 3D NAND dielectric stack 110. A CTF transistor gate dielectric such as oxide/nitride/oxide (ONO) is deposited on the sidewalls of the high aspect ratio channel openings 115. Over the CTF transistor gate dielectric, CTF transistor channel material 130 such as polysilicon is deposited. Each 3D NAND CTF transistor is separated vertically from adjacent CTF transistors by horizontal layers of dielectric 122. The word lines 124 is coupled to the gates of individual transistors, where a voltage may be applied to turn on the channel of the corresponding CTF transistor. The CTF transistor channel material 130 electrically contacts a first bit line 132 (transistor source) in the substrate 100 at the bottom of the high aspect ratio channel opening 115 and contacts a second bit line 134 (transistor drain) on the top end of the high aspect ratio channel opening 115. The bit lines 132 and 134 run perpendicular to the word lines 124.

Still referring to FIG. 1, the substrate 100 may further comprise the staircase structure 140 where multi-level contacts (MLC) 144 may be formed using a highly selective MLC etch process in accordance with various embodiments. The staircase structure 140 is designed to allow an electrical contact to be formed for each of the word lines 124 from different layers within the 3D NAND dielectric stack 110. Accordingly, the MLC 144 comprises contacts with different lengths to reach different layers of the word lines 124 as illustrated in FIG. 1. For illustration purpose, only some contacts of the MLC 144 are illustrated. As illustrated in FIG. 1, the 3D NAND dielectric stack 110 is covered by a pre-metal dielectric (PMD) layer 142. In various embodiments, the PMD layer 142 has a thickness approximately same as the thickness of the 3D NAND dielectric stack 110. Contact holes for the MLC 144 are etched through the thick PMD layer 190 stopping on the word lines 124. These contact holes can be filled with metal to provide electrical connection between the word lines 124 and overlying metal interconnect leads (not shown). This process flow of MLC formation in the staircase structure 140 will be further described below referring to FIGS. 2A-2G in accordance with various embodiments.

FIGS. 2A-2G illustrate cross-sectional views of an example substrate 100 at various stages of fabricating a 3D NAND memory array in accordance with various embodiments. Only a staircase portion of the substrate 100 that can be seen from the view angle indicated by a dotted arrow in FIG. 1 is illustrated in FIGS. 2A-2G.

Figure 2A:
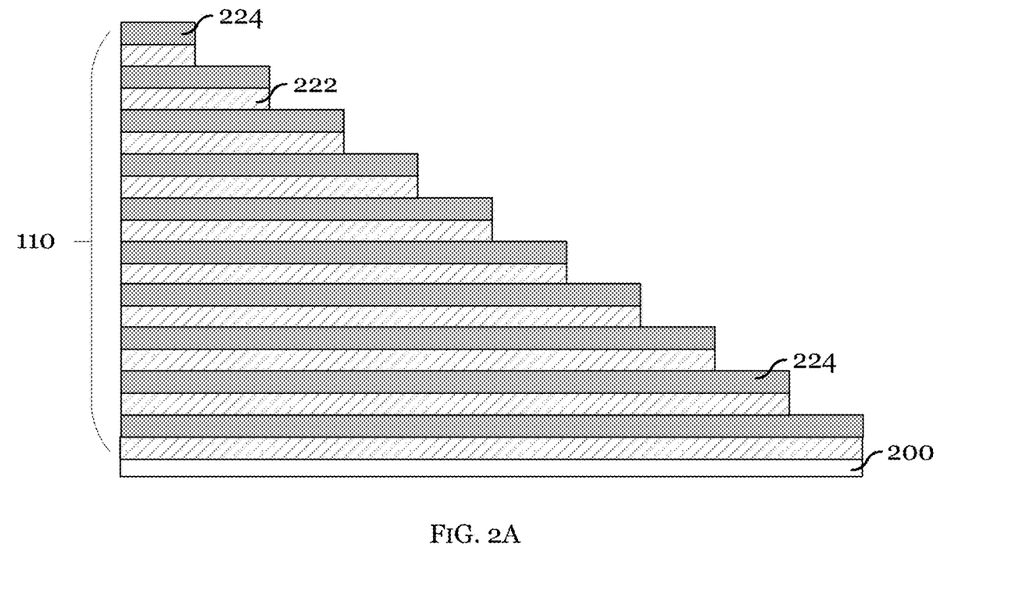
FIG. 2A illustrates an incoming substrate with a staircase structure comprising word lines at different levels.
Figure 3A:
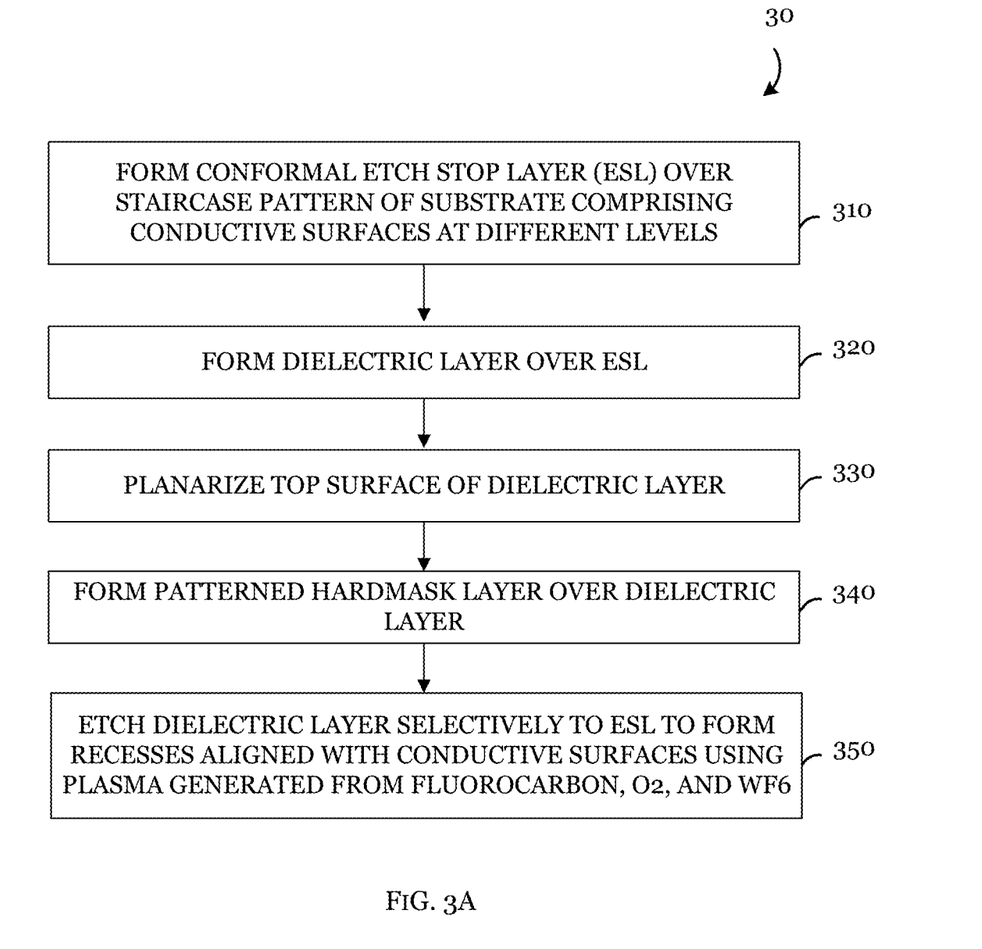
Figure 3B:
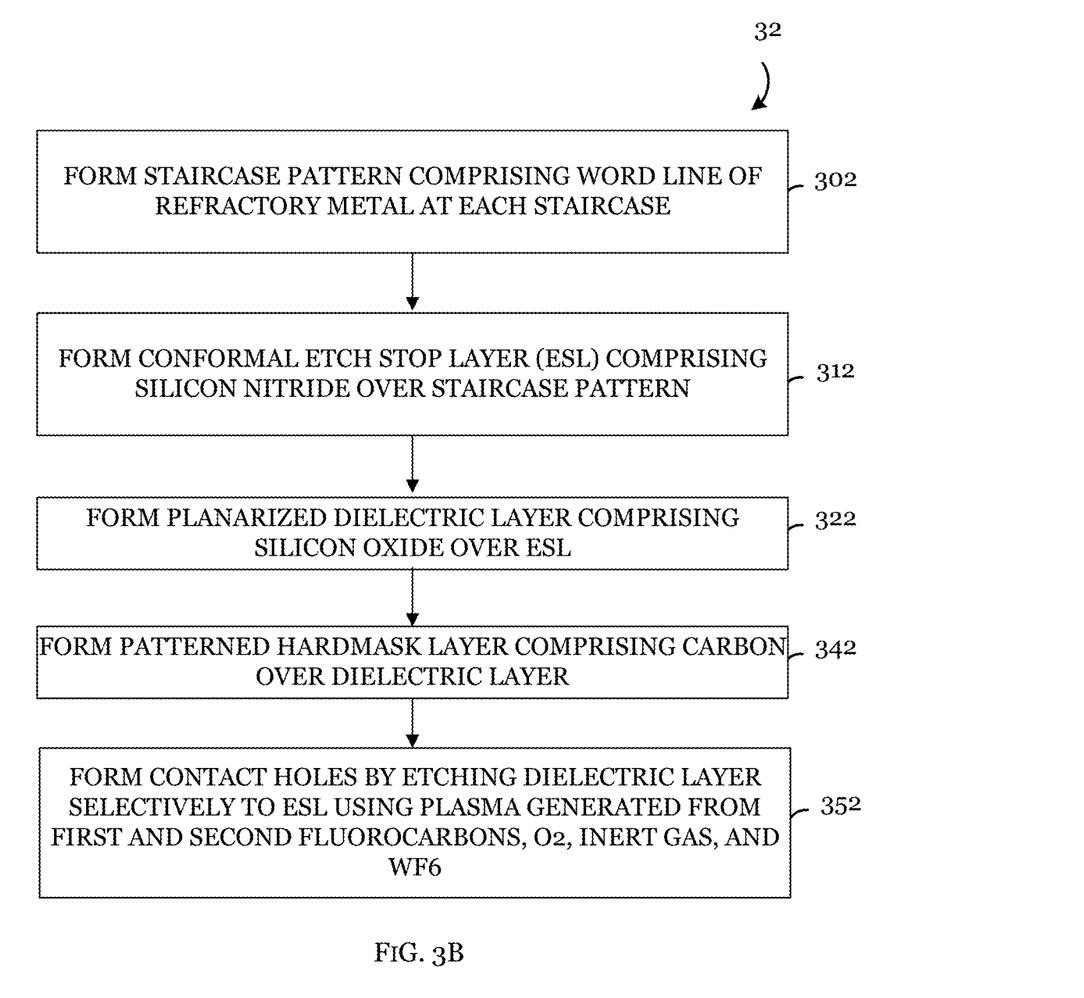
FIG. 3B illustrates another embodiment.
Figure 3C:
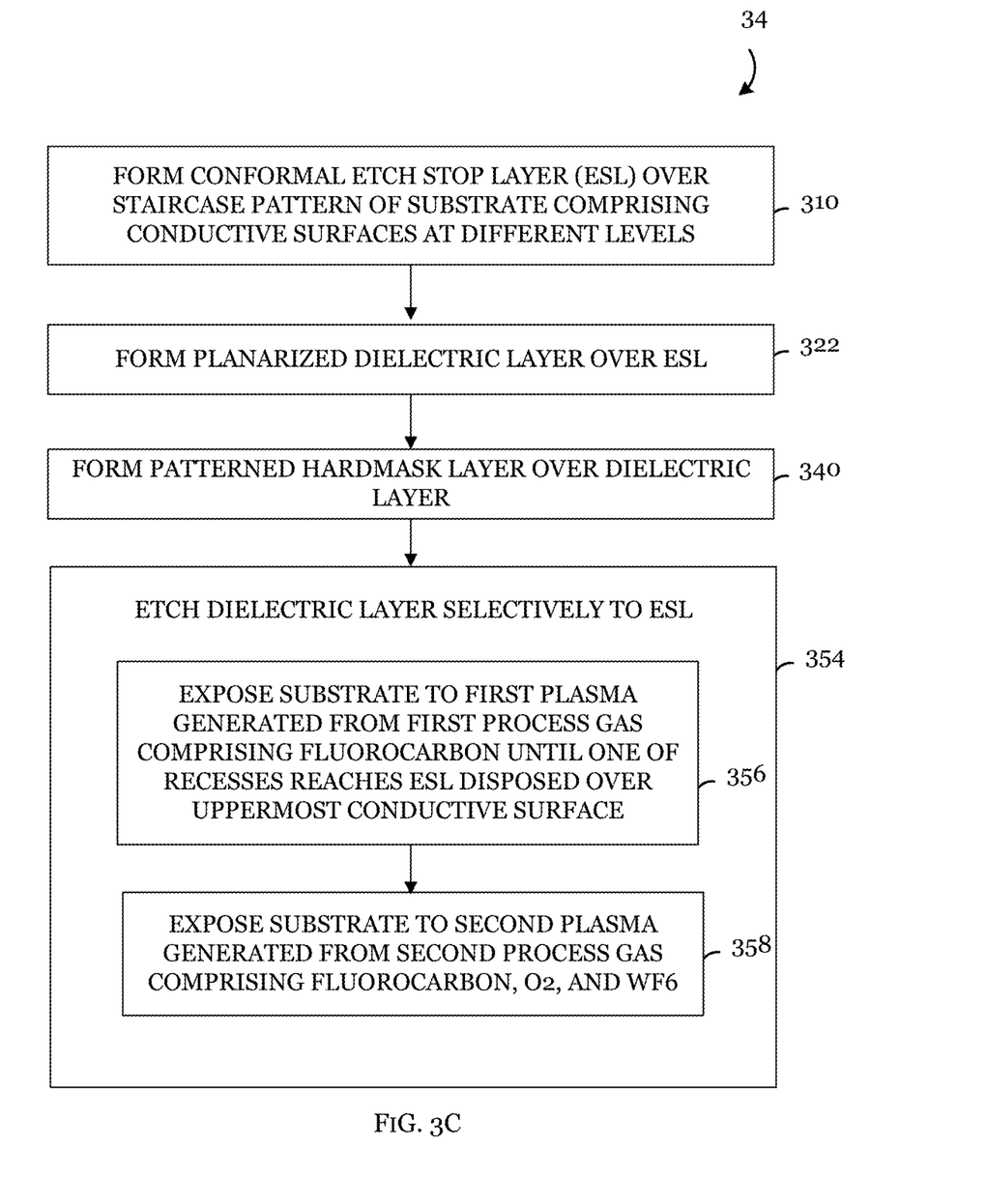
FIG. 3C illustrates yet another embodiment.

In FIG. 2A, an incoming substrate 200 with a staircase structure comprising word lines 224 at different levels. Each staircase comprises a dielectric layer 222 and a layer of word line 224. In various embodiments, the dielectric layer 222 may comprise silicon oxide (e.g., $SiO_2$) and the word lines 224 may comprise W, Mo, or Ru. In one embodiment, the staircase structure may be between 10 µm and 20 µm in thickness. In another embodiment, the uppermost staircase is at least 10 µm higher than the lowest staircase. In yet another embodiment, the staircase structure may be between 20 µm and 200 µm in thickness. As described below, multi-level contacts (MLC) may be formed to contact each of the word lines 224 at each staircase. Although FIG. 2A illustrates only ten staircases, the staircase structure may comprise, for example, 96, 128, or 198 staircases in one embodiment, but in other embodiments, more staircases may be used, for example, 200 to 1000 staircases.

Figure 2B:
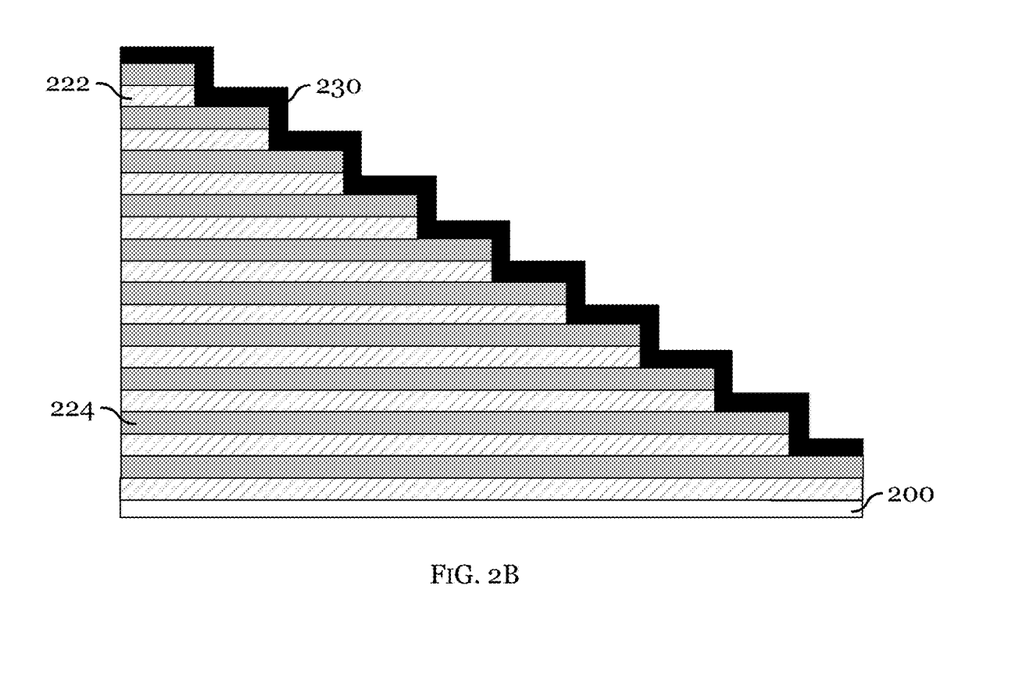
FIG. 2B illustrates the substrate after conformally depositing an etch stop layer (ESL) over the staircase structure.

FIG. 2B illustrates the substrate 200 after conformally depositing an etch stop layer (ESL) 230 over the staircase structure.

In various embodiments, the ESL 230 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 120 may be between 20 nm to 200 nm, and in one embodiment, it may be between 50 nm and 150 nm. The ESL 230 may comprise a dielectric material that provides a high etch selectivity during the MLC etch process (e.g., FIGS. 2D-2E). In various embodiments, the ESL 230 may comprise silicon nitride.

Figure 2C:
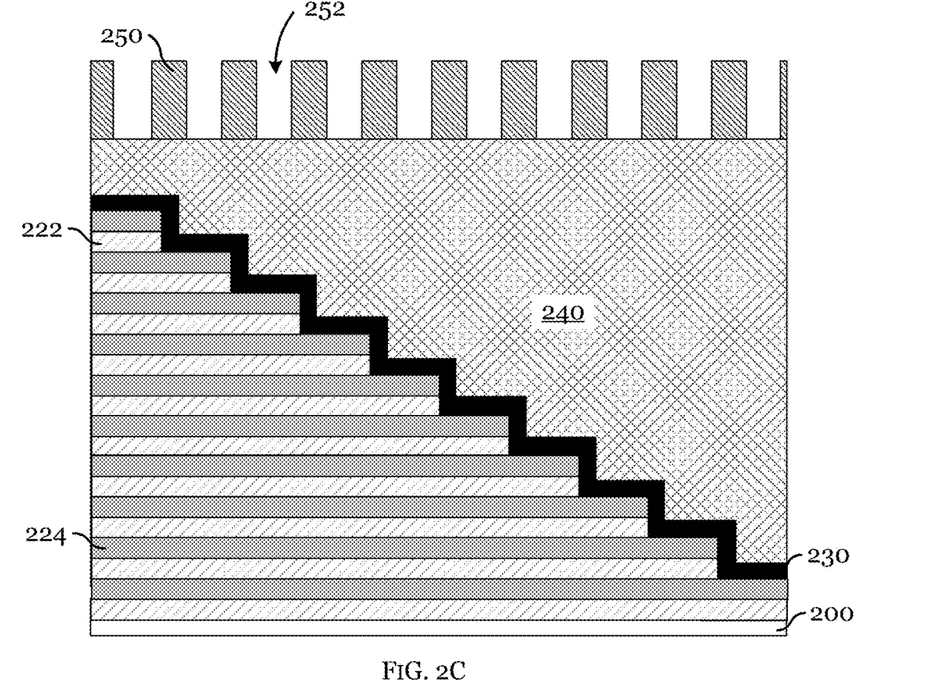
FIG. 2C illustrates the substrate after depositing a pre-metal dielectric (PMD) layer over the staircase structure and forming a patterned hardmask layer over the PMD layer.

FIG. 2C illustrates the substrate 200 after depositing a pre-metal dielectric (PMD) layer 240 over the staircase structure and forming a patterned hardmask layer 250 over the PMD layer 240.

The PMD layer 240 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. The PMD layer 240 may comprise a dielectric material such as silicon oxide. Dielectric materials for the ESL 230 and the PMD layer 240 may be selected in view of etch selectivity during the MLC etch process. In one embodiment, the ESL 230 comprises silicon nitride and the PMD layer 240 comprises silicon oxide. In various embodiments, the PMD layer 240 has a sufficient thickness to cover the entire staircase structure of the substrate 200. In various embodiments, the top surface of the PMD layer 240 may be planarized prior to forming the patterned hardmask layer 250. In one or more embodiments, the height distance between the top surface of the PMD layer 240 after planarization and the top surface of the staircase structure (e.g., the top surface of the ESL 230 or the top word line) may be between 0.5 µm and 1.5 µm.

Still referring to FIG. 2C, the patterned hardmask layer 250 may be formed over the planarized surface of the PMD layer 240. In various embodiments, a layer of hardmask may be deposited using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The hardmask may then patterned using a photoresist and lithographic process. Therefore, in one or more embodiments, during the patterning of the hardmask, a layer stack comprising multiple layers, for example, a tri-layer stack commonly used for a photolithographic process, may be present.

In various embodiments, the hardmask may comprise amorphous carbon layer (ACL). The ACL may be doped with a dopant such as boron (B). In certain embodiments, the patterned hardmask layer 250 may comprise a layer stack of multiple mask materials (e.g., soft ACL and hard ACL). The relative thicknesses of the hardmask and the PMD layer 240 may have any suitable relationship. In certain embodiments, the patterned hardmask layer 250 has a thickness between 1 µm and 4 µm. In one embodiment, the patterned hardmask layer 250 has a thickness of 2.5 µm.

In various embodiments, the patterned hardmask layer 250 is patterned to provide a recess pattern 252 that is aligned with staircases of the staircase structure of the substrate 200 such that each recess may be extended to form contact holes for multi-level contacts (MLC) to land on the individual word lines. Accordingly, in certain embodiments, the recess pattern 252 may comprise a number of recesses that matches with the number of the staircases (e.g., 32 or 48 recesses in the illustrated plane of the substrate 200 in FIG. 2C).

Figure 2D:
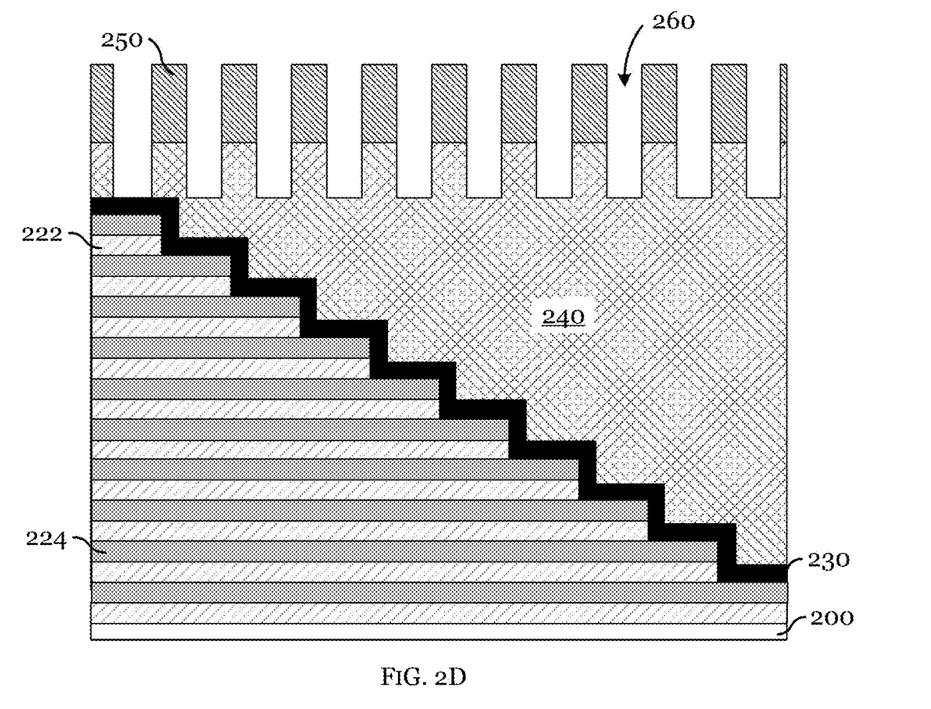
FIG. 2D illustrates the substrate during a multi-level contact (MLC) etch process where a contact hole reaches a top staircase of the staircase structure.

FIG. 2D illustrates the substrate during a multi-level contact (MLC) etch process where a contact hole 260 reaches a top staircase of the staircase structure.

Figure 2E:
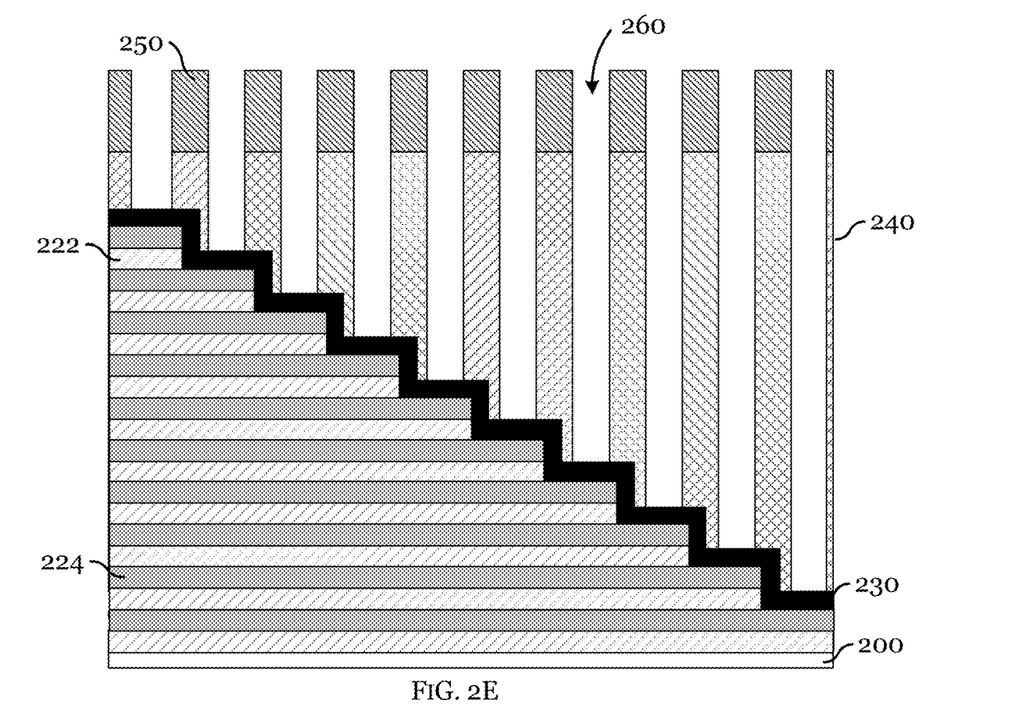
FIG. 2E illustrates the substrate after completing the MLC etch process where each contact hole reaches a respective staircase of the staircase structure at a different level.

FIG. 2E illustrates the substrate 200 after completing the MLC etch process where each contact hole 260 reaches a respective individual staircase of the staircase structure.

The MLC etch process transfers the pattern of the patterned hardmask layer 250 to the PMD layer 240 to form the contact holes 260 that vary in depth from one another. In FIG. 2D, an early stage of the MLC etch process is illustrated where the uppermost staircase protected by the ESL 230 is exposed at the bottom of one of the contact holes 260 being fabricated. In other words, the formation of the shallowest contact hole is complete at this stage, yet the MLC etch process must continue to extend other contact holes further to the levels of subsequent staircases. It is highly desired for the MLC etch process to stop at the ESL 230, while maintaining the etch rate and the contact hole profiles until all of the contact holes 260 may be formed. In FIG. 2E, contact holes 260 are illustrated to have a perfect straight profile without any bowing and distortion.

In various embodiments, the MLC etch process may be performed by a plasma etch process using halogen-based etch chemistry. For example, a fluorocarbon ($C_xF_y$) may be used as a primary etch gas. The fluorocarbon gas may be saturated or unsaturated. Examples of such a process gas include but are not limited to tetrafluoromethane ($CF_4$), octafluoropropane ($C_3F_8$), hexafluoropropylene ($C_3F_6$), perfluorobutane ($C_4F_{10}$), octafluorocyclobutane ($C_4F_8$), octafluoro-2-butene ($C_4F_8$), perflenapent ($C_5F_{12}$), hexafluorobutadiene ($C_4F_6$), hexafluoro-2-butyne ($C_4F_6$), and hexafluorocyclobutene ($C_4F_6$). Using fluorocarbon for the MLC etch process, a carbonaceous polymer comprising fluorine (CF polymer) may advantageously deposited and provide some passivation to enhance etch selectivity to the ESL 230 and maintain contact hole profile. However, the inventors of this application identified that stringent process recipes may be necessary for the MLC etch process to enable forming acceptable contact hole profiles. Such requirements may include long residence time to allow gas dissociation, high electrostatic chuck (ESC) temperature, high $C_xF_y$ flow rates, and low $O_2$ flow rates, for example. Without proper process control, CF polymer deposition may not be sufficient and leads to gouging of or punching through the ESL 230 and the word lines 224, particularly at shallower contact holes. Further, while high polymer flux to the contact bottom may enhance the etch selectivity to the ESL 230, it may also reduce mask selectivity and/or cause contact hole distortion.

To overcome these issues during the MLC etch process, various embodiments of the methods of this disclosure use incorporating a metal fluoride such as $WF_6$ in the process gas. The inventors of this application identified that the addition of a small amount of $WF_6$ in the process gas may substantially improve the MLC etch process. The effect of $WF_6$ may have several benefits. First, for an oxide etch, the etch selectivity to nitride may be substantially improved by both slowing or completely stopping nitride etch and improving the oxide etch rate. Although not wishing to be limited by any theory, in one example, $WF_6$ in the plasma can induce metal nitride formation to replace silicon nitride (e.g., ESL 230). The metal nitride such as tungsten nitride (e.g., $W_2N$) is expected to show a superior etch resistivity than silicon nitride (e.g., $Si_3N_4$), and thereby leading to better etch selectivity. At the same time, the metal does not deposit on or interact with the oxide surface, which may prevent any adverse effect on the oxide etch rate. In addition, the addition of $WF_6$ may also benefit minimizing the contact distortion and bowing. In other embodiments, a metal fluoride may comprise a refractory metal other than W.

To advantageously affect the MLC etch process, only a small amount of $WF_6$ may be needed. In various embodiments, the flow rate of $WF_6$ may be less than 1% of the total process gas flow rate, for example, between 0.01% and 1%. In certain embodiments, it may be less than 0.3% of the total process gas flow rate. In another embodiment, the flow rate of $WF_6$ may be determined in relation to one component of the primary etch gas (e.g., a fluorocarbon), for example between 1% and 2% of a flow rate of the component. An excessive amount of $WF_6$ (e.g., >1% of the total gas flow) may lead to an undesired deposit on the substrate, chamber walls, and other surfaces in the equipment, and thereby a minimal amount of $WF_6$ addition may be used in various embodiments.

In certain embodiments, a combination of multiple etch gases may be used for the MLC etch process. For example, two fluorocarbon gases (e.g., $C_4F_8$ and $C_4F_6$, or $C_3F_8$ and $C_4F_6$) may be used. In various embodiments, other gases such as a diluent gas (e.g., Ar, He, or $N_2$) and/or a balancing agent (e.g., $O_2$ or CO) may also be added. For example, in certain embodiments, argon (Ar) and dioxygen ($O_2$) may be included as the diluent gas and the balancing agent, respectively. In another embodiment, dinitrogen ($N_2$) and $O_2$ may be included in the process gas. Although not wishing to be limited by any theory, the use of a diluent gas may improve the etch selectivity. In alternate embodiments, the combination of gases may further comprise another fluorocarbon. In one embodiment, the additional fluorocarbon or may be carbon tetrafluoride ($CF_4$).

In one or more embodiments, the MLC etch process may use a combination of gases comprising $C_3F_8$, $C_4F_6$, Ar, $O_2$, and $WF_6$. Conventionally, to achieve desired etch process profile and balance the etch rate and selectivity, the process may need to satisfy the stringent process recipe requirements (e.g., long residence time, high ESC temperature, high $C_xF_y$ flow rates, and low $O_2$ flow rate). Since the addition of $WF_6$ can deliver similar or better benefits in the etch performance, some or all of these requirements may advantageously be relaxed. For example, compared to some conventional methods, a lower ESC temperature, a reduced $C_xF_y$ flow rates, a higher $O_2$ flow rate, or a combination thereof may be used without an adverse effect.

In various embodiments, gas flow rates may be mass basis and controlled by one or more mass flow controllers at a gas inlet system to introduce the gas to a plasma processing chamber. Accordingly, unless otherwise noted, gas flow rates refer to those at the point of entry to the plasma processing chamber. In certain embodiment, the flow rate ratio of the first fluorocarbon and the second fluorocarbon is between 2:1 and 2:3.

In one embodiment, the flow rate ratio of $C_3F_8$, $C_4F_6$, and $O_2$ may be 1:1:2, where the flow rate of $WF_6$ may be between 0.1% and 0.3% of the total gas flow rate. In another embodiment, a $C_3F_8$ flow rate is between 30 standard cubic centimeters per minute (sccm) and 60 sccm, a $C_4F_6$ flow rate is between 60 sccm and 120 sccm, and a $O_2$ flow rate is between 30 sccm and 60 sccm. In certain embodiments, the flow rate of the $WF_6$ is less than 2 sccm, for example between 0.1 sccm and 2 sccm. In certain embodiments, $WF_6$ may be pulsed into the plasma processing chamber instead of a constant flow, which may enable introducing a gas amount that is less than a lower limit of a constant flow rate provided by a mass flow controller.

In yet another embodiment, the MLC etch process may further use CO at a gas flow rate between 200 sccm and 600 sccm, $N_2$ at a gas flow rate between 100 sccm and 200 sccm, or both.

The contact holes 260 are generally formed as a series of holes that include a conformal, high aspect ratio (HAR) feature. Features with aspect ratio (ratio of height of the feature to the width of the feature) higher than 20:1 are generally considered to be high aspect ratio features, and in various embodiments, some of the contact holes 260 may have at least such an aspect ratio, while some shallow holes may have an aspect ratio less than 20:1. In one embodiment, of the contact holes 260, the shallowest hole may have an aspect ratio of about 3:1 and the deepest hole may have an aspect ratio between 40:1 and 100:1 In certain embodiments, the contact holes 260 may vary in depth from 2 μm and 19 μm, and the MLC etch process may etch the PMD layer 240 for more than 15 μm in depth for deep contact holes at once. Advantageously, the MLC etch process in various embodiments may achieve such HAR features with a total process time less than 1 hour.

Still referring to FIGS. 2D and 2E, the multi-level contact (MLC) etch process may be performed under a single process condition throughout the process in certain embodiments, but in other embodiments, more than one process conditions may also be used still as a continuous plasma etch process. For example, one plasma condition may be used for an initial stage of the MLC etch process until the uppermost staircase is exposed (FIG. 2D) and then another plasma condition may be used for the rest of the MLC etch process (FIG. 2E). Such embodiments may advantageously optimize the process time and efficiency because the etch selectivity to the ESL 230 has to be taken into consideration only after the PMD layer 240 is etched to the level of the uppermost staircase. Therefore, the first process condition for the initial stage may be tuned to provide the optimal etch rate and mask selectivity and the second condition after the initial stage may be tuned to provide the best balance of the etch rate, mask selectivity, ESL selectivity, and contact hole profile. In one embodiment, the initial stage may account for less than 20% of a total process time of the MLC etch process. In another embodiment, the initial stage of the MLC etch process may be performed without adding $WF_6$, or the flow rate of $WF_6$ during the initial stage may be less than that for the rest of the etch process.

Further, in alternate embodiments, the MLC etch process may comprise an initial etch using a first primary etch gas (e.g., $CF_4$) to etch the PMD layer 240 until the uppermost staircase is exposed (FIG. 2D), followed by a main etch using a second primary etch gas (e.g., $C_3F_8$, $C_4F_8$, or $C_4F_6$) used for the rest of the MLC etch process (FIG. 2E). In one embodiment, the initial etch may etch about 200 nm of the PMD layer 240. The initial etch may be performed without $WF_6$, and the main etch may be performed with the addition of $WF_6$. In one or more embodiments, the initial $WF_6$ flow rate during the main etch may be at a first value, and it may be changed to a second value during the main etch. Alternately, the $WF_6$ flow rate during the main etch may be continuously increased or decreased with process time. In one or more embodiments, various process parameters including process gas composition, gas flow rates, ESC temperature, and source and bias power may be kept constant or dynamically adjusted during the MLC etch process according to a process recipe. Since the MLC etch process is used to form recesses with varying depth, it may be desired to gradually adjust the process parameters as the etch progresses. For example, as the MLC etch process proceeds, the fluorocarbon, CO, and/or $N_2$ flow rates may be increased while the $O_2$ flow rate may be decreased. The chamber pressure and source power (high frequency and low frequency power) may also be increased. These process parameters may be adjusted continuously or stepwise. Accordingly, the $WF_6$ flow rate may also be dynamically adjusted in consideration of the etch rate, mask selectivity, ESL selectivity, and contact hole profile.

Figure 2F:
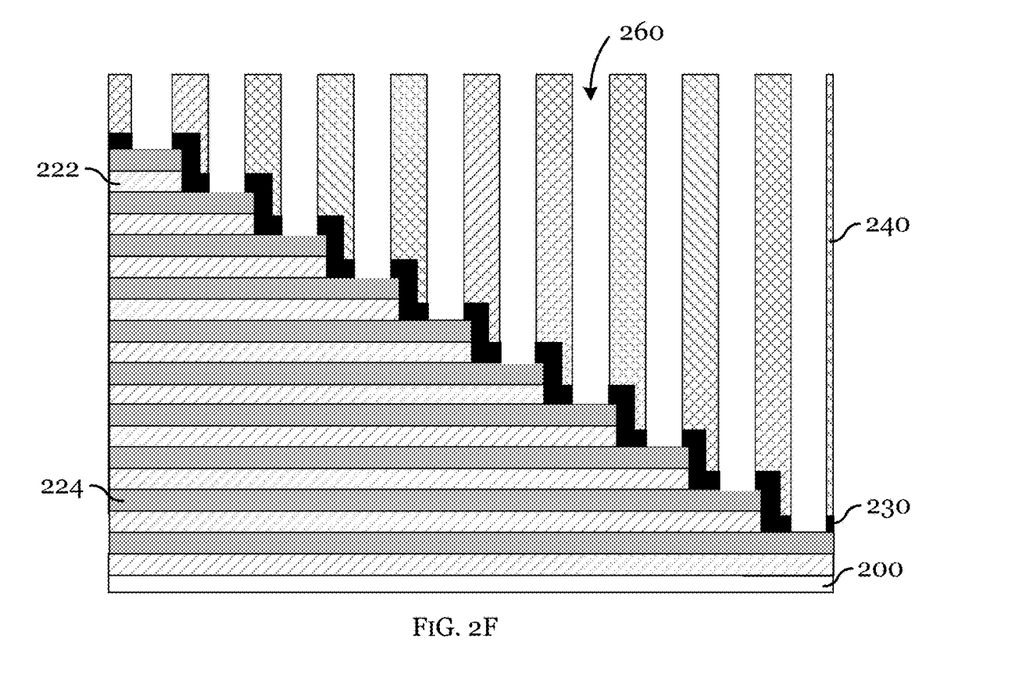
FIG. 2F illustrates the substrate after a ESL removal etch.

FIG. 2F illustrates the substrate 220 after an ESL removal etch.

After the multi-level contact (MLC) etch process, another etch process may be performed to remove the ESL 230 to expose the word lines 224 using an appropriate etch technique. At this stage, any remaining hardmask may also be removed by, for example, ashing. Any CF polymer deposited may also be removed.

Figure 2G:
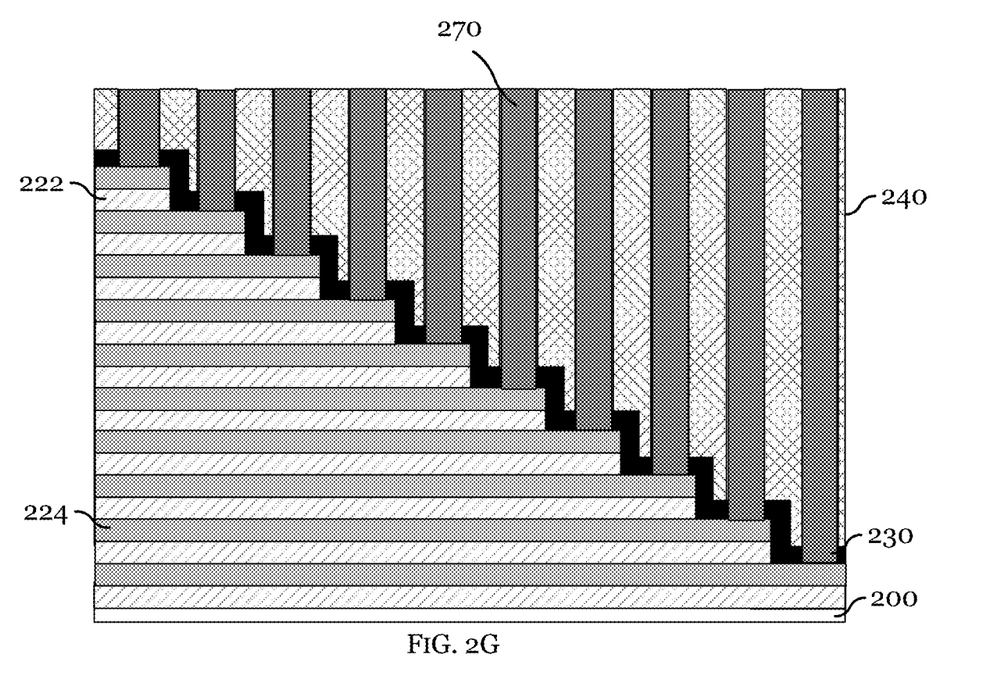
FIG. 2G illustrates the substrate after filling the contact holes with a conductive material to form staircase contacts.

FIG. 2G illustrates the substrate 200 after filling the contact holes with a conductive material 270 to form staircase contacts.

After the MLC etch process, the contact holes in FIG. 2F may be filled with the conductive material 270 to form the multi-level contacts (MLC) that provides electrical contact to each of the word line 224. Subsequently, additional processing steps can be performed to form the circuits required to program, read, and write the 3D NAND memory array; to form peripheral logic circuits; and to form overlying metal interconnect layers in the 3D NAND integrated circuit.

FIGS. 3A-3C illustrate process flow charts of methods of multi-level contact (MLC) etch in accordance with various embodiments. The process flow can be followed with the figures (FIGS. 2A-2G) discussed above and hence will not be described again.

In FIG. 3A, a process flow 30 starts with forming a conformal etch stop layer (ESL) over a staircase pattern of a substrate, where each staircase comprises a conductive surface (block 310, FIG. 2B). Over the ESL, a dielectric layer may then be formed (block 320, FIG. 2C) and planarized (block 330, FIG. 2C). Subsequently, a patterned hardmask layer may be formed over the dielectric layer (block 340, FIG. 2C). The MLC etch may then be performed by etching the dielectric layer selectively to the ESL using the patterned hardmask layer as an etch mask to form a plurality of recesses, where each of the plurality of recesses lands on each staircase and the ESL protects the conductive surface from the etching (block 350, FIGS. 2D-2E). In various embodiments, the MLC etch comprises exposing the substrate to a plasma generated from a process gas comprising a fluorocarbon, dioxygen ($O_2$), and tungsten hexafluoride ($WF_6$), where the flow rate of $WF_6$ is between 0.01% and 1% of the total flow rate of the process gas.

In FIG. 3B, another process flow 32 starts with forming a staircase pattern having multiple staircases over a substrate, where each staircase comprises a word line comprising a refractory metal (block 302, FIG. 2A). Next, a conformal etch stop layer (ESL) comprising silicon nitride may be formed over the staircase pattern (block 312, FIG. 2B). A dielectric layer comprising silicon oxide may then be formed and planarized over the ESL (block 322, FIG. 2C), followed by forming a patterned hardmask layer comprising carbon over the dielectric layer (block 342, FIG. 2C). Subsequently, a plurality of contact holes may be formed by etching the dielectric layer selectively to the ESL using the patterned hardmask layer as an etch mask, where each contact hole is aligned with each word line and each word line remains covered by the ESL after the etching (block 352, FIGS. 2D-2E). In various embodiments, the etching may comprise exposing the substrate to a plasma generated in a plasma processing chamber from a process gas comprising first and second unsaturated fluorocarbons, dioxygen ($O_2$), a diluent gas, and tungsten hexafluoride ($WF_6$), where the flow rate of $WF_6$ is between 1% and 2% of the flow rate of the first unsaturated fluorocarbon.

In FIG. 3C, yet another process flow 34 starts with forming a conformal etch stop layer (ESL) over a staircase pattern of a substrate, where the staircase pattern comprises a plurality of conductive surfaces, each of the plurality of conductive surfaces is separated and at a different level from each other (block 310, FIG. 2B). Next, a dielectric layer may be formed and planarized over the ESL (block 322, FIG. 2C), followed by forming a patterned hardmask layer over the dielectric layer (block 340, FIG. 2C). Subsequently, the dielectric layer may be etched selectively to the ESL using the patterned hardmask layer as an etch mask (block 354), where the substrate may be first exposed to a first plasma generated in a plasma processing chamber from a first process gas comprising a fluorocarbon, the exposing to the first plasma forming a plurality of recesses aligned with the plurality of conductive surfaces (block 356, FIG. 2D). After one of the plurality of recesses reaches at a portion of the ESL disposed over an uppermost one of the plurality of conductive surfaces, the substrate may then be exposed to a second plasma generated in the plasma processing chamber from a second process gas comprising the fluorocarbon, dioxygen ($O_2$), and tungsten hexafluoride ($WF_6$), while the ESL prevents each of the plurality of conductive surfaces from being exposed at the bottom of each of the plurality of recesses (block 358, FIG. 2E).

Figure 4:
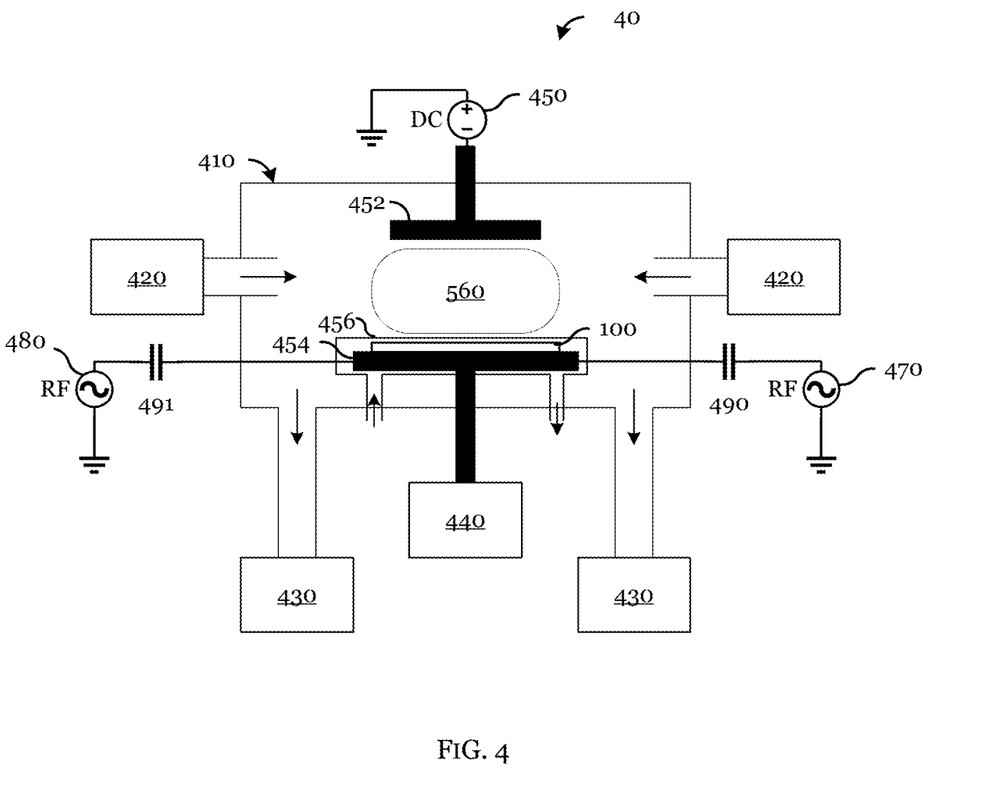
FIG. 4 illustrates a plasma processing system for performing a process of semiconductor fabrication in accordance with various embodiments.

FIG. 4 illustrates a plasma processing system 40 for performing a process of semiconductor fabrication in accordance with various embodiments.

For illustrative purposes, FIG. 4 illustrates a substrate 100 placed on a substrate holder 454 (e.g., a circular electrostatic chuck (ESC)) inside a plasma processing chamber 410 near the bottom. The substrate 100 may be optionally maintained at a desired temperature using a heater/cooler 456 that surrounds the substrate holder 454. The temperature of the substrate 100 may be maintained by a temperature controller 440 connected to the substrate holder 454 and the heater/cooler 456. The ESC may be coated with a conductive material (e.g., a carbon-based or metal-nitride based coating) so that electrical connections may be made to the substrate holder 554.

As illustrated in FIG. 4, the substrate holder 454 may be a bottom electrode of the plasma processing chamber 410. In the illustrative example in FIG. 4, the substrate holder 454 is connected to two RF-bias power sources, 470 and 480 through blocking capacitors 490 and 491. In some embodiment, a conductive circular plate inside the plasma processing chamber 410 near the top is the top electrode 452. In FIG. 4, the top electrode 452 is connected to a DC power source 450 of the plasma processing system 40.

The gases may be introduced into the plasma processing chamber 410 by a gas delivery system 420. The gas delivery system 420 comprises multiple gas flow controllers to control the flow of multiple gases into the chamber. Each of the gas flow controllers of the gas delivery system 420 may be assigned for each of fluorocarbons, noble gases, and/or balancing agents. In some embodiments, optional center/edge splitters may be used to independently adjust the gas flow rates at the center and edge of the substrate 100.

The RF-bias power sources 470 and 480 may be used to supply continuous wave (CW) or pulsed RF power to sustain the plasma, such as a plasma 460. The plasma 460, shown between the top electrode 452 and the bottom electrode (also the substrate holder 454), exemplifies direct plasma generated close to the substrate 100 in the plasma processing chamber 410 of the plasma processing system 40. Etching may be performed by exposing the substrate 100 to the plasma 460 while powering the substrate holder 454 with RF-bias power sources 470, 480 and optionally the top electrode 452 with the DC power source 450.

The configuration of the plasma processing system 40 described above is a capacitively coupled plasma (CCP) processing system, but by example only. In alternative embodiments, various alternative configurations may be used for the plasma processing system 40. For example, inductively coupled plasma (ICP) may be used with RF source power coupled to a planar coil over a top dielectric cover, the gas inlet and/or the gas outlet may be coupled to the upper wall, etc. In various embodiments, the RF power, chamber pressure, substrate temperature, gas flow rates and other plasma process parameters may be selected in accordance with the respective process recipe. In some embodiments, the plasma processing system 40 may be a resonator such as a helical resonator.

As described above, various embodiments of the methods for multi-level contact (MLC) etch are based on a plasma etch using one or more fluorocarbons and a small addition of $WF_6$. The addition of $WF_6$ may advantageously increase throughput for an MLC process by improving oxide etch rate. Further, it may improve oxide-to-nitride etch selectivity, or even induce a complete etch stop on a silicon nitride layer (e.g., ESL 230 in FIGS. 2B-2G). Further, the mask selectivity may also be improved. In addition, the methods may advantageously improve contact hole profile by mitigating bowing and bottom CD distortion.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method of processing a substrate that includes: forming a conformal etch stop layer (ESL) over a staircase pattern of the substrate, the staircase pattern including a plurality of staircases, each of the plurality of staircases including a conductive surface; forming a dielectric layer over the ESL; planarizing a top surface of the dielectric layer; forming a patterned hardmask layer over the dielectric layer; and etching the dielectric layer selectively to the ESL using the patterned hardmask layer as an etch mask to form a plurality of recesses, each of the plurality of recesses landing on each of the plurality of staircases, the ESL protecting the conductive surface from the etching, the etching including exposing the substrate to a plasma generated from a process gas including a fluorocarbon, dioxygen ($O_2$), and tungsten hexafluoride ($WF_6$), a flow rate of $WF_6$ being between 0.01% and 1% of a total gas flow rate of the process gas.

Example 2. The method of example 1, where the ESL including silicon nitride and the dielectric layer including silicon oxide.

Example 3. The method of one of examples 1 or 2, where the patterned hardmask layer includes amorphous carbon layer (ACL).

Example 4. The method of one of examples 1 to 3, where one of the plurality of conductive surfaces is at least 10 μm higher than another of the plurality of conductive surfaces.

Example 5. The method of one of examples 1 to 4, where the etching is a continuous process with a total process time less than 1 hour.

Example 6. The method of one of examples 1 to 5, where the fluorocarbon includes $C_3F_8$, $C_4F_6$, or $C_4F_8$.

Example 7. The method of one of examples 1 to 6, where the process gas includes $C_3F_8$ and $C_4F_6$.

Example 8. A method of forming a 3D NAND memory cell that includes: forming a staircase pattern including multiple staircases over the substrate, each staircase including a word line including a refractory metal; forming a conformal etch stop layer (ESL) including silicon nitride over the staircase pattern; forming a planarized dielectric layer including silicon oxide over the ESL; forming a patterned hardmask layer including carbon over the dielectric layer; and forming a plurality of contact holes by etching the dielectric layer selectively to the ESL using the patterned hardmask layer as an etch mask, the plurality of contact holes aligned with the staircase pattern such that each contact hole lands on each staircase, each word line being covered by the ESL after the etching, the etching including flowing first and second fluorocarbons, dioxygen ($O_2$), a diluent gas, and tungsten hexafluoride ($WF_6$) to a plasma processing chamber, a flow rate of $WF_6$ being between 1% and 2% of a flow rate of the first fluorocarbon, and exposing the substrate to a plasma generated in the plasma processing chamber while flowing the gases.

Example 9. The method of example 8, further including: extending the plurality of contact holes by etching through the ESL to expose each of the plurality of word lines; and filling the plurality of contact holes with a conductive material.

Example 10. The method of one of examples 8 or 9, further including forming a plurality of bit lines over the plurality of filled contact holes.

Example 11. The method of one of examples 8 to 10, where the first fluorocarbon is $C_3F_8$ and the second fluorocarbon is $C_4F_6$.

Example 12. The method of one of examples 8 to 11, where the diluent gas includes dinitrogen ($N_2$) or a noble gas.

Example 13. The method of one of examples 8 to 12, where a flow rate of the $WF_6$ is between 0.1 sccm and 2 sccm.

Example 14. The method of one of examples 8 to 13, where a flow rate ratio of the first fluorocarbon and the second fluorocarbon is between 2:1 and 2:3.

Example 15. The method of one of examples 8 to 14, where the process gas further includes a third fluorocarbon, a flow rate ratio of the first fluorocarbon and the third fluorocarbon is between 2:3 and 2:5.

Example 16. A method of processing a substrate that includes: forming a conformal etch stop layer (ESL) over a staircase pattern of the substrate, the staircase pattern including a plurality of conductive surfaces, each of the plurality of conductive surfaces is separated and at a different level from each other; forming a planarized dielectric layer over the ESL; forming a patterned hardmask layer over the dielectric layer; and etching the dielectric layer selectively to the ESL using the patterned hardmask layer as an etch mask, the etching including exposing the substrate to a first plasma generated in a plasma processing chamber from a first process gas including a fluorocarbon, the exposing to the first plasma forming a plurality of recesses aligned with the plurality of conductive surfaces, and after one of the plurality of recesses reaches at a portion of the ESL disposed over an uppermost one of the plurality of conductive surfaces, exposing the substrate to a second plasma generated in the plasma processing chamber from a second process gas including the fluorocarbon, dioxygen ($O_2$), and tungsten hexafluoride ($WF_6$), the exposing to the second plasma extending the plurality of recesses while the ESL prevents each of the plurality of conductive surfaces from being exposed at the bottom of each of the plurality of recesses.

Example 17. The method of example 16, where a total process time for etching the dielectric layer until a deepest one of the plurality of recesses reaches to the ESL is less than 1 hour.

Example 18. The method of one of examples 16 or 17, where a process time for the exposing to the second plasma is between 1% and 20% of a total process time for etching the dielectric layer.

Example 19. The method of one of examples 16 to 18, where the first process gas further includes $WF_6$ at a first concentration and the second process gas includes $WF_6$ at a second concentration that is different from the first concentration.

Example 20. The method of one of examples 16 to 19, where the ESL includes silicon nitride, where the plurality of conductive surfaces includes a refractory metal, and where the dielectric layer includes silicon oxide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    forming a conformal etch stop layer (ESL) over a staircase pattern of the substrate, the staircase pattern comprising a plurality of staircases, each staircase of the plurality of staircases comprising a respective conductive surface;
    forming a dielectric layer over the ESL;
    planarizing a top surface of the dielectric layer;
    forming a patterned hardmask layer over the dielectric layer; and
    etching the dielectric layer selectively to the ESL using the patterned hardmask layer as an etch mask to form a plurality of recesses, each of the plurality of recesses landing on each staircase of the plurality of staircases, the ESL protecting the respective conductive surface from the etching, the etching comprising exposing the substrate to a plasma generated from a process gas comprising a fluorocarbon, dioxygen ($O_2$), and tungsten hexafluoride ($WF_6$), a flow rate of $WF_6$ being between 0.01% and 1% of a total gas flow rate of the process gas.

2. The method of claim 1, wherein the ESL comprising silicon nitride and the dielectric layer comprising silicon oxide.

3. The method of claim 1, wherein the patterned hardmask layer comprises an amorphous carbon layer (ACL).

4. The method of claim 1, wherein one of the respective conductive surfaces is at least 10 μm higher than another of the plurality of conductive surfaces.

5. The method of claim 1, wherein the etching is a continuous process with a total process time less than 1 hour.

6. The method of claim 1, wherein the fluorocarbon comprises $C_3F_8$, $C_4F_6$, or $C_4F_8$.

7. The method of claim 1, wherein the process gas comprises $C_3F_8$ and $C_4F_6$.

8. A method of forming a 3D NAND memory cell, the method comprising:
    forming a staircase pattern comprising multiple staircases over a substrate, each staircase comprising a respective word line comprising a refractory metal;
    forming a conformal etch stop layer (ESL) comprising silicon nitride over the staircase pattern;
    forming a planarized dielectric layer comprising silicon oxide over the ESL;
    forming a patterned hardmask layer comprising carbon over the dielectric layer; and
    forming a plurality of contact holes by etching the dielectric layer selectively to the ESL using the patterned hardmask layer as an etch mask, the plurality of contact holes aligned with the staircase pattern such that each contact hole lands on each staircase, each respective word line being covered by the ESL after the etching, the etching comprising
        flowing first and second fluorocarbons, dioxygen ($O_2$), a diluent gas, and tungsten hexafluoride ($WF_6$) to a plasma processing chamber, a flow rate of $WF_6$ being between 1% and 2% of a flow rate of the first fluorocarbon, and exposing the substrate to a plasma generated in the plasma processing chamber while flowing the gases.

9. The method of claim 8, further comprising:

extending the plurality of contact holes by etching through the ESL to expose each respective word line; and filling the plurality of contact holes with a conductive material.

10. The method of claim 9, further comprising forming a plurality of bit lines over the plurality of filled contact holes.

11. The method of claim 8, wherein the first fluorocarbon is $C_3F_8$ and the second fluorocarbon is $C_4F_6$.

12. The method of claim 8, wherein the diluent gas comprises dinitrogen ($N_2$) or a noble gas.

13. The method of claim 8, wherein a flow rate of the $WF_6$ is between 0.1 sccm and 2 sccm.

14. The method of claim 8, wherein a flow rate ratio of the first fluorocarbon and the second fluorocarbon is between 2:1 and 2:3.

15. The method of claim 8, wherein the process gas further comprises a third fluorocarbon, a flow rate ratio of the first fluorocarbon and the third fluorocarbon is between 2:3 and 2:5.

16. A method of processing a substrate, the method comprising:

forming a conformal etch stop layer (ESL) over a staircase pattern of the substrate, the staircase pattern comprising a plurality of conductive surfaces, each of the plurality of conductive surfaces is separated and at a different level from each other;

forming a planarized dielectric layer over the ESL;

forming a patterned hardmask layer over the dielectric layer; and etching the dielectric layer selectively to the ESL using the patterned hardmask layer as an etch mask, the etching comprising exposing the substrate to a first plasma generated in a plasma processing chamber from a first process gas comprising a fluorocarbon, the exposing to the first plasma forming a plurality of recesses aligned with the plurality of conductive surfaces, and after one of the plurality of recesses reaches at a portion of the ESL disposed over an uppermost one of the plurality of conductive surfaces, exposing the substrate to a second plasma generated in the plasma processing chamber from a second process gas comprising the fluorocarbon, dioxygen ($O_2$), and tungsten hexafluoride ($WF_6$), the exposing to the second plasma extending the plurality of recesses while the ESL prevents each of the plurality of conductive surfaces from being exposed at the bottom of each of the plurality of recesses.

17. The method of claim 16, wherein a total process time for etching the dielectric layer until a deepest one of the plurality of recesses reaches to the ESL is less than 1 hour.

18. The method of claim 16, wherein a process time for the exposing to the second plasma is between 1% and 20% of a total process time for etching the dielectric layer.

19. The method of claim 16, wherein the first process gas further comprises $WF_6$ at a first concentration and the second process gas comprises $WF_6$ at a second concentration that is different from the first concentration.

20. The method of claim 16, wherein the ESL comprises silicon nitride, wherein the plurality of conductive surfaces comprises a refractory metal, and wherein the dielectric layer comprises silicon oxide.

* * * * *